United States Patent
Jo et al.

(10) Patent No.: US 9,590,013 B2
(45) Date of Patent: Mar. 7, 2017

(54) DEVICE SWITCHING USING LAYERED DEVICE STRUCTURE

(71) Applicant: Crossbar, Inc., Santa Clara, CA (US)

(72) Inventors: Sung Hyun Jo, Sunnyvale, CA (US); Wei Lu, Ann Arbor, MI (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/509,967

(22) Filed: Oct. 8, 2014

(65) Prior Publication Data

US 2015/0021538 A1 Jan. 22, 2015

Related U.S. Application Data

(63) Continuation of application No. 12/861,432, filed on Aug. 23, 2010, now Pat. No. 8,884,261.

(51) Int. Cl.
| | | |
|---|---|---|
| *H01L 45/00* | (2006.01) | |
| *H01L 27/24* | (2006.01) | |
| *G11C 13/00* | (2006.01) | |
| *H04L 12/721* | (2013.01) | |

(52) U.S. Cl.
CPC ...... *H01L 27/2463* (2013.01); *G11C 13/0009* (2013.01); *H01L 45/085* (2013.01); *H01L 45/1233* (2013.01); *H01L 45/148* (2013.01); *H01L 45/16* (2013.01); *H04L 45/12* (2013.01); *G11C 2213/15* (2013.01); *G11C 2213/33* (2013.01); *G11C 2213/51* (2013.01)

(58) Field of Classification Search
CPC ....................................... H01L 45/00
USPC .......................................................... 257/4
See application file for complete search history.

(56) References Cited

U.S. PATENT DOCUMENTS

| | | | |
|---|---|---|---|
| 680,652 | A | 8/1901 | Leonard |
| 4,433,468 | A | 2/1984 | Kawamata |
| 4,684,972 | A | 8/1987 | Owen et al. |

(Continued)

FOREIGN PATENT DOCUMENTS

| | | |
|---|---|---|
| CN | 101131872 A | 2/2008 |
| CN | 101170132 | 4/2008 |

(Continued)

OTHER PUBLICATIONS

Notice of Allowance mailed Sep. 18, 2014 for U.S. Appl. No. 13/920,021, 8 pages.

(Continued)

*Primary Examiner* — Marc Armand
(74) *Attorney, Agent, or Firm* — Amin, Turocy & Watson, LLP

(57) ABSTRACT

A resistive switching device. The device includes a first electrode comprising a first metal material overlying the first dielectric material and a switching material comprising an amorphous silicon material. The device includes a second electrode comprising at least a second metal material. In a specific embodiment, the device includes a buffer material disposed between the first electrode and the switching material. The buffer material provides a blocking region between the switching material and the first electrode so that the blocking region is substantially free from metal particles from the second metal material when a first voltage is applied to the second electrode.

20 Claims, 6 Drawing Sheets

(56) References Cited

U.S. PATENT DOCUMENTS

| | | |
|---|---|---|
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |

(56) References Cited

U.S. PATENT DOCUMENTS

| | | |
|---|---|---|
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2003/0006440 A1* | 1/2003 | Uchiyama ............ 257/295 |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0246606 A1 | 11/2006 | Hsu et al. |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1* | 1/2009 | Lu ............ H01L 27/2472 257/4 |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0283737 A1 | 11/2009 | Kiyotoshi |
| 2009/0298224 A1 | 12/2009 | Lowrey |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |

(56) References Cited

U.S. PATENT DOCUMENTS

| | | |
|---|---|---|
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0161277 A1 | 6/2011 | Nishihara et al. |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2016/0111640 A1 | 4/2016 | Chang et al. |

FOREIGN PATENT DOCUMENTS

| | | |
|---|---|---|
| CN | 101501850 | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 | 1/2008 |
| JP | 2008147343 | 6/2008 |

(56) References Cited

FOREIGN PATENT DOCUMENTS

| | | |
|---|---|---|
| JP | 2009043873 | 2/2009 |
| JP | 2011023645 A | 2/2011 |
| JP | 2011065737 | 3/2011 |
| JP | 2012504840 | 2/2012 |
| JP | 2012505551 | 3/2012 |
| JP | 2012089567 | 5/2012 |
| JP | 2012533195 | 12/2012 |
| KR | 20090051206 A | 5/2009 |
| KR | 20110014248 A | 2/2011 |
| WO | WO03034498 A1 | 4/2003 |
| WO | 2005124787 | 12/2005 |
| WO | WO2009005699 A1 | 1/2009 |
| WO | 2010026654 | 3/2010 |
| WO | 2010042354 | 4/2010 |
| WO | 2010042732 | 4/2010 |
| WO | 2011008654 | 1/2011 |
| WO | WO2011005266 A1 | 1/2011 |
| WO | 2011133138 A1 | 10/2011 |

OTHER PUBLICATIONS

Notice of Allowance mailed Sep. 18, 2014 for U.S. Appl. No. 13/586,815, 9 pages.
Notice of Allowance mailed Jun. 19, 2012 for U.S. Appl. No. 12/861,650, 7 pages.
Notice of Allowance mailed Sep. 19, 2013 for U.S. Appl. No. 13/585,759, 8 pages.
Notice of Allowance mailed Feb. 20, 2014 for U.S. Appl. No. 13/468,201, 10 pages.
Notice of Allowance mailed Mar. 20, 2014 for U.S. Appl. No. 13/598,550, 8 pages.
Notice of Allowance mailed Oct. 21, 2011 for U.S. Appl. No. 12/582,086, 8 pages.
Notice of Allowance mailed Oct. 21, 2014 for U.S. Appl. No. 13/426,869, 11 pages.
Notice of Allowance mailed May 22, 2012 for U.S. Appl. No. 12/815,369, 10 pages.
Notice of Allowance mailed Oct. 23, 2013 for U.S. Appl. No. 13/417,135, 11 pages.
Notice of Allowance mailed Jan. 24, 2013 for U.S. Appl. No. 13/314,513, 5 pages.
Notice of Allowance mailed Jul. 24, 2012 for U.S. Appl. No. 12/939,824, 5 pages.
Notice of Allowance mailed Oct. 25, 2012 for U.S. Appl. No. 12/894,087, 8 pages.
Notice of Allowance mailed Sep. 25, 2014 for U.S. Appl. No. 13/447,036, 11 pages.
Notice of Allowance mailed Sep. 26, 2014 for U.S. Appl. No. 13/594,665, 9 pages.
Notice of Allowance mailed Aug. 27, 2014 for U.S. Appl. No. 13/077,941, 9 pages.
Notice of Allowance mailed Nov. 28, 2012 for U.S. Appl. No. 13/290,024, 9 pages.
Notice of Allowance mailed Oct. 28, 2013 for U.S. Appl. No. 13/194,500, 13 pages.
Notice of Allowance mailed Oct. 28, 2013 for U.S. Appl. No. 13/651,169, 10 pages.
Notice of Allowance mailed Nov. 29, 2012 for U.S. Appl. No. 12/815,318, 8 pages.
Notice of Allowance mailed Oct. 29, 2012 for U.S. Appl. No. 13/149,807, 8 pages.
Notice of Allowance mailed May 30, 2012 for U.S. Appl. No. 12/833,898, 5 pages.
Notice of Allowance mailed Sep. 30, 2013 for U.S. Appl. No. 13/481,696, 9 pages.
Notice of Allowance mailed Aug. 31, 2012 for U.S. Appl. No. 13/051,296, 8 pages.
Notice of Allowance mailed Oct. 8, 2014 for U.S. Appl. No. 13/077,941, 4 pages.
Office Action mailed Apr. 1, 2013 for U.S. Appl. No. 13/174,077, 15 pages.
Office Action mailed Aug. 1, 2012 for U.S. Appl. No. 12/894,098, 31 pages.
Office Action mailed Mar. 1, 2012 for U.S. Appl. No. 12/835,704, 18 pages.
Office Action mailed Aug. 2, 2013 for U.S. Appl. No. 13/594,665, 35 pages.
Office Action mailed Sep. 2, 2014 for U.S. Appl. No. 13/705,082, 41 pages.
Office Action mailed Apr. 3, 2014 for U.S. Appl. No. 13/870,919, 56 pages.
Office Action mailed Oct. 3, 2013 for U.S. Appl. No. 13/921,157, 21 pages.
Office Action mailed Apr. 5, 2012 for U.S. Appl. No. 12/833,898, 17 pages.
Office Action mailed Oct. 5, 2011 for U.S. Appl. No. 11/875,541, 16 pages.
Office Action mailed Apr. 6, 2015 for U.S. Appl. No. 14/034,390, 27 pages.
Office Action mailed Dec. 6, 2013 for U.S Appl. No. 13/564,639, 28 pages.
Office Action mailed Dec. 6, 2013 for U.S Appl. No. 13/960,735, 19 pages.
Office Action mailed Feb. 6, 2014 for U.S. Appl. No. 13/434,567, 34 pages.
Office Action mailed Mar. 6, 2013 for U.S. Appl. No. 13/174,264, 30 pages.
Office Action mailed Mar. 6, 2013 for U.S. Appl. No. 13/679,976, 27 pages.
Office Action mailed Sep. 6, 2011 for U.S. Appl. No. 12/582,086, 19 pages.
Office Action mailed Dec. 7, 2012 for U.S. Appl. No. 13/436,714, 30 pages.
Office Action mailed Mar. 7, 2013 for U.S. Appl. No. 13/651,169, 15 pages.
Office Action mailed May 7, 2013 for U.S. Appl. No. 13/585,759, 22 pages.
European Office Action dated Aug. 8, 2012 for European Application No. EP11005207, 4 pages.
Office Action mailed Jan. 8, 2014 for U.S. Appl. No. 12/861,432, 23 pages.
Office Action mailed Jun. 8, 2012 for U.S. Appl. No. 111875,541, 18 pages.
Office Action mailed Aug. 9, 2013 for U.S. Appl. No. 13/764,710, 15 pages.
Office Action mailed Jul. 9, 2013 for U.S. Appl. No. 13/447,036, 26 pages.
Office Action mailed Jul. 9, 2014 for U.S. Appl. No. 14/166,691, 18 pages.
Jo S.H., et al., "Experimental, Modeling and Simulation Studies of Nanoscale Resistance Switching Devices", Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 370-874.
Jo S.H. et al., "High-Density Crossbar Arrays Based on a Si Memristive System", Supporting Information, 2009, pp. 1-4.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.

(56) References Cited

OTHER PUBLICATIONS

Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, 2009, pp. 1-4.
Kim et al., "Nanoscale Resistive Memory with Intrinsic Diode Characteristics and Long Endurance," Applied Physics Letters, 2010, vol. 96, pp. 053106-1 - 053106-3.
Kund M., et al., "Conductive Bridging Ram (cbram): An Emerging Non-volatile Memory Technology Scalable to Sub 20nm", IEEE, 2005.
Le Comber P.G., at al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Mar. 10, 2016.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance mailed Sep. 4, 2014 for U.S. Appl. No. 13/761,132, 6 pages.
Notice of Allowance mailed Oct. 5, 2011 for U.S. Appl. No. 12/940,920, 8 pages.
Notice of Allowance mailed Feb. 6, 2012 for U.S. Appl. No. 12/835,699, 7 pages.
Notice of Allowance mailed Feb. 6, 2013 for U.S. Appl. No. 13/118,258, 9 pages.
Notice of Allowance mailed Aug. 8, 2013 for U.S. Appl. No. 13/733,828, 9 pages.
Notice of Allowance mailed Jan. 8, 2013 for U.S. Appl. No. 12/814,410, 8 pages.
Notice of Allowance mailed Oct. 8, 2013 for U.S. Appl. No. 13/769,152, 9 pages.
Notice of Allowance mailed Oct. 8, 2013 for U.S. Appl. No. 13/905,074, 10 pages.
Notice of Allowance mailed Apr. 9, 2013 for U.S. Appl. No. 13/748,490, 8 pages.
Corrected Notice of Allowability mailed Sep. 9, 2014 for U.S. Appl. No. 13/620,012, 2 pages.
Notice of Allowance mailed Sep. 9, 2014 for U.S. Appl. No. 13/870,919, 5 pages.
Notice of Allowance mailed Oct. 10, 2013 for U.S. Appl. No. 13/452,657, 10 pages.
Supplemental Notice of Allowability mailed Jan. 11, 2013 for U.S. Appl. No. 12/894,087, 2 pages.
Notice of Allowance mailed May 11, 2012 for U.S. Appl. No. 12/939,824, 8 pages.
Notice of Allowance mailed Mar. 12, 2012 for U.S. Appl. No. 12/913,719, 5 pages.
Notice of Allowance mailed Nov. 13, 2013 for U.S. Appl. No. 13/461,725, 10 pages.
Notice of Allowance mailed Nov. 14, 2012 for U.S. Appl. No. 12/861,666, 5 pages.
Notice of Allowance mailed Nov. 14, 2012 for U.S. Appl. No. 13/532,019, 8 pages.
Notice of Allowance mailed Mar. 15, 2013 for U.S. Appl. No. 12/894,098, 12 pages.
Notice of Allowance mailed Oct. 16, 2013 for U.S. Appl. No. 13/174,264, 7 pages.
Notice of Allowance mailed Apr. 17, 2012 for U.S. Appl. No. 13/158,231, 7 pages.
Notice of Allowance mailed Jan. 17, 2014 for U.S. Appl. No. 13/725,331, 8 pages.
Notice of Allowance mailed Mar. 17, 2014 for U.S. Appl. No. 13/592,224, 8 pages.
Notice of Allowance mailed Sep. 17, 2013 for U.S. Appl. No. 13/679,976, 8 pages.
Notice of Allowance mailed Sep. 17, 2014 for U.S. Appl. No. 13/960,735, 9 pages.
Notice of Allowance mailed Sep. 17, 2014 for U.S. Appl. No. 13/462,653, 7 pages.
Notice of Allowance mailed Sep. 18, 2012 for U.S. Appl. No. 12/900,232, 8 pages.
Advisory Action mailed Jun. 8, 2012 for U.S. Appl. No. 121835,704 filed on Jul. 13, 2012.
Avila A., et al., "Switching in Coplanar Amorphous Hydrogenated Silicon Devices," Solid-State Electronics, 2000, vol. 44 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., et al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-394.
Corrected Notice of Allowability mailed Oct. 1, 2013 for U.S. Appl. No. 13/733,828, 5 pages.
Corrected Notice of Allowability mailed Jan. 11, 2013 for U.S. Appl. No. 12/861,666, 8 pages.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey, "Electrothermal Model of Switching in Amorphous Silicon Films," Journal of Vacuum Science & Technology, 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
Ex parte Quayle Action mailed May 8, 2012 for U.S. Appl. No. 12/826,653, filed Jun. 29, 2010.

(56) References Cited

OTHER PUBLICATIONS

Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet:.
Jo S.H., et al., "CMOS Compatible Nanoscale Nonvolatile Resistance Switching Memory," Nano Letters, 2008, vol. 8 (2), pp. 392-397.
Hajto J., et al, "Analogue Memory and Ballistic Electron Effects in Metal-amorphous Silicon Structures," Philosophical Magazine, 1991, vol. 63 (1), pp. 349-369.
Hajto J., et aL, "Electronic Switching in Amorphous-Semiconductor Thin Films", Chapter 14, 1992, pp. 640-701.
Hajto J., et al, "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p. sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hudgens S., et al., "Overview of Phase-Change Chalcogenide Nonvolatile Memory Technology", MRS Bulletin, Nov. 2004, pp. 829-832. Retrieved from the Internet:.
International Search Report and Written Opinion for Application No. PCT/US2011/040362, mailed on Jan. 19, 2012, 1 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 9 pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report and Written Opinion for Application No. PCT/US2013/061244, mailed on Jan. 28, 2014, 3 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Jian Hu, et al., "Area-Dependent Switching in Thin Film-Silicon Devices," Materials Research Society Symposium Proceedings, 2003, vol. 762, pp. A 18.3.1-A 18.3.6.
Jian Hu., et al., "Switching and Filament Formation in hot-wire CVD p-type a-Si:H devices," Thin Solid Films, Science Direct, 2003, vol. 430, pp. 249-252.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Office Action mailed Sep. 30, 2013 for U.S. Appl. No. 13/189,401, 42 pages.
Office Action mailed Sep. 30, 2013 for U.S. Appl. No. 13/462,653, 35 pages.
Owen A. E., et al., "Electronic Switching in Amorphous Silicon Devices: Properties of the Conducting Filament", Proceedings of 5th International Conference on Solid-State and Integrated Circuit Technology, IEEE, 1998, pp. 330-833.
Owen A. E., et al., "Memory Switching in Amorphous Silicon Devices," Journal of Non-Crystalline Solids, 1983, vol. 50-60 (Pt. 2), pp. 1273-1280.
Owen A. E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M. J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J. C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31.
Suehle J. S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for PCT Application No. PCT/US2009/060023, mailed on May 18, 2010, 3 pages.
Written Opinion for PCT Application No. PCT/US2009/061249, mailed on May 19, 2010, 3 pages.
Written Opinion for PCT Application No. PCT/US2011/040090, mailed on Feb. 17, 2012, 6 pages.
Written Opinion for PCT Application No. PCT/US2011/045124, mailed on May 29, 2012, 5 pages.
Written Opinion for PCT Application No. PCT/US2011/046036, mailed on Feb. 23, 2012, 4 pages.
Yin S., "Solution Processed Silver Sulfide Thin Films for Filament Memory Applications", Technical Report No. UCB/ EECS-2010-166, Dec. 17, 2010, Electrical Engineering and Computer Sciences, University of California at Berkeley.
Yuan H. C., et al., "Silicon Solar Cells with Front Hetero-Contact and Aluminum Alloy Back Junction", NREL conference Paper CP-520-42566, 33rd IEEE Photovoltaic Specialists Conference, May 11-16, 2008, National Renewable Energy Laboratory, San Diego, California.
Zankovych S., et al., "Nanoimprint Lithography: Challenges and Prospects," Nanotechnology, 2001, vol. 12, pp. 91-95.
Notice of Allowance for U.S. Appl. No. 14/611,022 dated Feb. 12, 2016, 13 pages.
Notice of Allowance for U.S. Appl. No. 14/611,022 dated Sep. 10, 2015, 13 pages.
Office Action for U.S. Appl. No. 14/611,022 dated May 7, 2015, 13 pages.
Office Action for European Application No. EP11005207.3 dated Aug. 8, 2012, 4 pages.

(56) References Cited

OTHER PUBLICATIONS

European Search Report for European Application No. EP11005649 mailed Oct. 15, 2014, 2 pages.
Japanese Office Action (English Translation) for Japanese Application No. 2011-153349 mailed Feb. 24, 2015, 3 pages.
Japanese Search Report (English Translation) for Japanese Application No. 2011-153349 dated Feb. 9, 2015, 11 pages.
Japanese Office Action (English Translation) for Japanese Application No. 2013-525926 mailed Mar. 3, 2015, 4 pages.
Japanese Search Report (English Translation) for Japanese Application No. 2013-525926 dated Feb. 9, 2015, 15 pages.
Japanese Office Action (English Translation) for Japanese Application No. 2014-513700 mailed Jan. 12, 2016, 4 pages.
Japanese Search Report (English Translation) for Japanese Application No. 2014-513700 dated Jan. 14, 2016, 25 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Apr. 3, 2015, 8 pages.
Chinese Office Action (English Translation) for Chinese Application No 201180050941.0 dated Dec. 9, 2015, 5 pages.
Chinese Search Report (English Translation) for Chinese Application No. 201180050941.0 dated Mar. 25, 2015, 1 page.
Chinese Office Action (with English Translation) for Chinese Application No. 201290000773.4 dated Jun. 9, 2014, 3 pages.
Chinese Office Action (English Translation) for Chinese Application No. 201280027066.9 dated Nov. 23, 2015, 5 pages.
Chinese Search Report (English Translation) for Chinese Application No. 201280027066.9 dated Nov. 13, 2015, 2 pages.
Office Action mailed Oct. 9, 2012 for U.S. Appl. No. 131417,135, 14 pages.
Office Action mailed Jan. 10, 2014 for U.S. Appl. No. 13/920,021, 34 pages.
Office Action mailed Apr. 11, 2014 for U.S. Appl. No. 13/143,047, 21 pages.
Office Action mailed Feb. 11, 2014 for U.S. Appl. No. 13/620,012, 54 pages.
Office Action mailed Jul. 11, 2013 for U.S. Appl. No. 13/764,698, 14 pages.
Office Action mailed Sep. 11, 2014 for U.S. Appl. No. 13/739,283, 32 pages.
Office Action mailed Aug. 12, 2013 for U.S. Appl. No. 13/077,941, 64 pages.
Office Action mailed Mar. 12, 2014 for U.S. Appl. No. 13/167,920, 23 pages.
Office Action mailed Sep. 12, 2014 for U.S. Appl. No. 13/426,869, 25 pages.
Office Action mailed Sep. 12, 2014 for U.S. Appl. No. 13/756,498, 43 pages.
Office Action mailed Feb. 13, 2014 for U.S. Appl. No. 13/174,077, 21 pages.
Office Action mailed Mar. 14, 2012 for U.S. Appl. No. 12/815,369, 18 pages.
Office Action mailed Mar. 14, 2014 for U.S. Appl. No. 12/835,704, 19 pages.
Office Action mailed Apr. 16, 2012 for U.S. Appl. No. 12/834,610, 23 pages.
Office Action mailed Jan. 16, 2014 for U.S. Appl. No. 13/739,283, 37 pages.
Office Action mailed May 16, 2012 for U.S. Appl. No. 12/815,318, 25 pages.
Office Action mailed Oct. 16, 2012 for U.S. Appl. No. 12/861,650, 29 pages.
Office Action mailed Apr. 17, 2012 for U.S. Appl. No. 12/814,410, 17 pages.
Office Action mailed Feb. 17, 2011 for U.S. Appl. No. 12/913,719, 17 pages.
Office Action mailed Apr. 19, 2011 for U.S. Appl. No. 12/582,086, 29 pages.
Office Action mailed Aug. 19, 2013 for U.S. Appl. No. 13/585,759, 15 pages.
Office Action mailed Jun. 19, 2012 for U.S. Appl. No. 13/149,757, 11 pages.
Office Action mailed Mar. 19, 2013 for U.S. Appl. No. 13/465,188, 13 pages.
Office Action mailed Mar. 19, 2013 for U.S. Appl. No. 13/564,639, 25 pages.
Office Action mailed May 20, 2013 for U.S. Appl. No. 13/725,331, 28 pages.
Office Action mailed Nov. 20, 2012 for U.S Appl. No. 13/149,653, 50 pages.
Office Action mailed Sep. 20, 2013 for U.S. Appl. No. 13/481,600, 25 pages.
Office Action mailed Mar. 21, 2014 for U.S. Appl. No. 13/447,036, 27 pages.
Office Action mailed May 21, 2014 for U.S. Appl. No. 13/764,698, 31 pages.
Office Action mailed Sep. 21, 2011 for U.S. Appl. No. 12/835,704, 19 pages.
Office Action mailed Jul. 22, 2010 for U.S. Appl. No. 11/875,541, 29 pages.
Office Action mailed Jul. 22, 2011 for U.S. Appl. No. 12/913,719, 13 pages.
Office Action mailed Sep. 22, 2014 for U.S. Appl. No. 13/189,401, 26 pages.
Office Action mailed May 23, 2013 for U.S. Appl. No. 13/592224, 21 pages.
Office Action mailed Aug. 24, 2011 for U.S. Appl. No. 12/835,699, 16 pages.
Office Action mailed Apr. 25, 2012 for U.S. Appl. No. 13/149,653, 25 pages.
Office Action mailed Apr. 25, 2014 for U.S. Appl. No. 13/761,132, 28 pages.
Office Action mailed Jan. 25, 2012 for U.S. Appl. No. 12/861,650, 20 pages.
Office Action mailed Sep. 25, 2013 for U.S. Appl. No. 13/194,479, 25 pages.
Office Action mailed Nov. 26, 2012 for U.S Appl. No. 13/156,232, 22 pages.
Office Action mailed Aug. 27, 2013 for U.S. Appl. No. 13/436,714, 20 pages.
Office Action mailed Dec. 27, 2013 for U.S Appl. No. 13/525,096, 23 pages.
Office Action mailed Mar. 27, 2012 for U.S. Appl. No. 13/314,513, 7 pages.
Office Action mailed Mar. 13, 2012 for U.S. Appl. No. 12/625,817, 27 pages.
Office Action mailed Jan. 29, 2014 for U.S. Appl. No. 13/586,815, 41 pages.
Office Action mailed Jul. 29, 2013 for U.S. Appl. No. 13/466,008, 27 pages.
Office Action mailed Mar. 29, 2013 for U.S. Appl. No. 12/861,432, 33 pages.
Office Action mailed Jul. 30, 2012 for U.S. Appl. No. 12/900,232, 13 pages.
Office Action mailed Jun. 30, 2014 for U.S. Appl. No. 13/531,449, 19 pages.
Office Action mailed Mar. 30, 2011 for U.S. Appl. No. 11/875,541, 17 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.

(56) References Cited

OTHER PUBLICATIONS

Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Jul. 12, 2012 for U.S. Appl. No. 13/463,714 filed May 3, 2012.
Office Action mailed Dec. 3, 2015 for U.S. Appl. No. 14/253,796.
Office Action mailed Mar. 13, 2012 for U.S. Appl. No. 12/625,817 filed 25 Nov. 2009.
Office Action mailed Apr. 15, 2016 for U.S. Appl. No. 14/597,151.
Office Action mailed Mar. 17, 2015 for U.S. Appl. No. 14/573,770.
Office Action mailed Oct. 25, 2012 for U.S. Appl. No. 13/461,725, filed May 1, 2012.
Office Action mailed Apr. 8, 2016 for U.S. Appl. No. 14/573,770.
Office Action mailed May 20, 2016 for U.S. Appl. No. 14/613,299.
Office Action mailed Jul. 9, 2015 for U.S. Appl. No. 14/573,817.
Chinese Office Action (with English Translation) for Chinese Application No. 201280027066.9 mailed on Jul. 4, 2016, 5 pages.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
European Office Action for Application No. 11005649.6 dated Dec. 1, 2014, 2 pages.
European Office Action for Application No. 11005649.6 dated Nov. 17, 2015, 5 pages.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096 filed Jun. 15, 2012.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pages.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S. Appl. No. 14/213,953 dated Feb. 16, 2016:21 pages.
Notice of Allowance for U.S. Appl. No. 14/611,022 dated Jun. 8, 2016, 57 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Jan. 16, 2014 for U.S. Appl. No. 13/921,157 filed Jun. 18, 2013.
Notice of Allowance mailed May 17, 2013 for U.S. Appl. No. 13/290,024.
Notice of Allowance mailed Apr. 2, 2013 for U.S. Appl. No. 13/149,757 filed May 31, 2011.
Notice of Allowance mailed Feb. 10, 2015 for U.S. Appl. No. 13/525,096 filed Jun. 15, 2012.
Notice of Allowance mailed Mar. 20, 2014 for U.S. Appl. No. 13/461,725, filed May 1, 2012.
Notice of Allowance mailed Dec. 23, 2015 for U.S. Appl. No. 14/573,770.
Notice of Allowance mailed Apr. 20, 2016 for U.S. Appl. No. 14/573,817.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.
Notice of Allowance dated Oct. 17, 2016 for U.S. Appl. No. 14/213,953, 43 pages.
Notice of Allowance for U.S. Appl. No. 14/611,022 dated Oct. 26, 2016, 41 pages.
Office Action for U.S Appl. No. 14/597,151 dated Oct. 20, 2016, 52 pages.
Notice of Allowance for U.S. Appl. No. 14/612,025 dated Oct. 19, 2016, 108 pages.
Notice of Allowance for U.S. Appl. No. 14/383,079 dated Aug. 17, 2016, 71 pages.
Notice of Allowance for U.S. Appl. No. 15/046,172 dated Oct. 4, 2016, 116 pages.
Notice of Allowance for U.S. Appl. No. 13/952,467 dated Sep. 28, 2016, 128 pages.

(56) References Cited

OTHER PUBLICATIONS

Japanese Office Action mailed on Aug. 9, 2016 for Japanese Application No. 2014-513700, 8 pages. (including translation).
Chinese Office Action mailed on Sep. 1, 2016 for Chinese Application No. 201380027469.8, 8 pages. (including translation).
Office Action for U.S. Appl. No. 14/588,136 dated Nov. 2, 2016, 132 pages.
Notice of Allowance for U.S. Appl. No. 14/692,677 dated Nov. 21, 2016, 97 pages.
corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.

* cited by examiner

DEVICE SWITCHING USING LAYERED DEVICE STRUCTURE

CROSS REFERENCE TO RELATED APPLICATIONS

The present application claims priority to and is a continuation of U.S. patent application Ser. No. 12/861,432, filed on Aug. 23, 2010. The entirety of this application is incorporated herein by reference, for all purposes.

BACKGROUND

The present invention is related to switching devices. More particularly, the present invention provides a structure for a resistive switching memory device. The resistive switching memory device has a reduced on state current to provide improved switching and endurance properties, among others.

The success of semiconductor devices has been mainly driven by an intensive transistor down-scaling process. However, as field effect transistors (FET) approach sizes less than 100 nm, problems such as short channel effect start to prevent proper device operation. Moreover, such sub 100 nm device size can lead to sub-threshold slope non-scaling and also increases power dissipation. It is generally believed that transistor based memories such as those commonly known as Flash may approach an end to scaling within a decade. Flash memory is one type of non-volatile memory device.

Other non-volatile random access memory (RAM) devices such as ferroelectric RAM (Fe RAM), magnetoresistive RAM (MRAM), organic RAM (ORAM), and phase change RAM (PCRAM), among others, have been explored as next generation memory devices. These devices often require new materials and device structures to couple with silicon based devices to form a memory cell, which lack one or more key attributes. For example, Fe-RAM and MRAM devices have fast switching characteristics and good programming endurance, but their fabrication is not CMOS compatible and size is usually large. Switching for a PCRAM device uses Joules heating, which inherently has high power consumption. Organic RAM or ORAM is incompatible with large volume silicon based fabrication and device reliability is usually poor.

From the above, an improved semiconductor memory device and techniques are therefore desirable

BRIEF SUMMARY OF THE PRESENT INVENTION

The present invention is related to switching devices. More particularly, the present invention provides a structure for a resistive switching memory device. The resistive switching memory device has a reduced on state current for improved switching and endurance properties, among others.

In a specific embodiment, a switching device structure is provided. The switching device includes a substrate having a surface region and a first dielectric material overlying the surface region. A first electrode overlies the first dielectric material. In a specific embodiment, the first electrode includes at least a metal material. The switching device includes a switching element and a buffer material disposed between the first electrode and the switching element. In a specific embodiment, the buffer material provides a blocking region between the switching material and the first electrode. The switching device includes a second electrode overlying the switching material. The second electrode includes at least a second metal material in a specific embodiment. In a specific embodiment, the blocking region is substantially free of metal particles formed from the second metal material when a first voltage (for example, a write voltage) is applied to the second electrode. In a specific embodiment, the buffer material prevents a high defect region to form between the switching material and the first electrode.

Many benefits are achieved by ways of present invention over conventional techniques. For example, the present resistive switching device can be fabricated using conventional equipment and processes. In addition, the present device uses a layer structure to reduce an on state current as well as power consumption. The layer structure further prevents an electrical connection between the electrodes and improves device endurance and reliability. Depending on the embodiment, one or more of these benefits may be realized. One skilled in the art would recognize other variations, modifications and alternatives.

DETAILED DESCRIPTION OF THE PRESENT INVENTION

The present invention is related to switching devices. More particularly, the present invention provides a structure for a resistive switching memory device. The resistive switching memory device is characterized by a reduced on state current for improved switching and endurance properties, among others.

Resistive switching memory device using a non-crystalline silicon such as amorphous silicon, amorphous-polysilicon and microcrystalline silicon as a switching material and metal electrodes has shown promises in a new class of high density memory devices for fast switching. As merely for illustration, amorphous silicon is used to describe non-crystalline silicon. The on/off behavior of the device depends on metal particles formed in defect sites within the amorphous silicon material. Due to mismatch of materials, defect level in an interface region formed from the amorphous silicon material and a metal electrode is high. As metal particles are formed in the defect sites of amorphous silicon material, these devices usually have a high on state current. Upon repeated cycling, the high on state current leads to shorting of the electrodes and device reliability and endurance are compromised, usually less than a few thousand on/off cycles. Embodiments according to the present invention provide a method and a structure to optimize on state current and improve endurance to more than $10^6$ on/off cycles, well suitable to be used in current and next generation memory devices.

Figure 1:
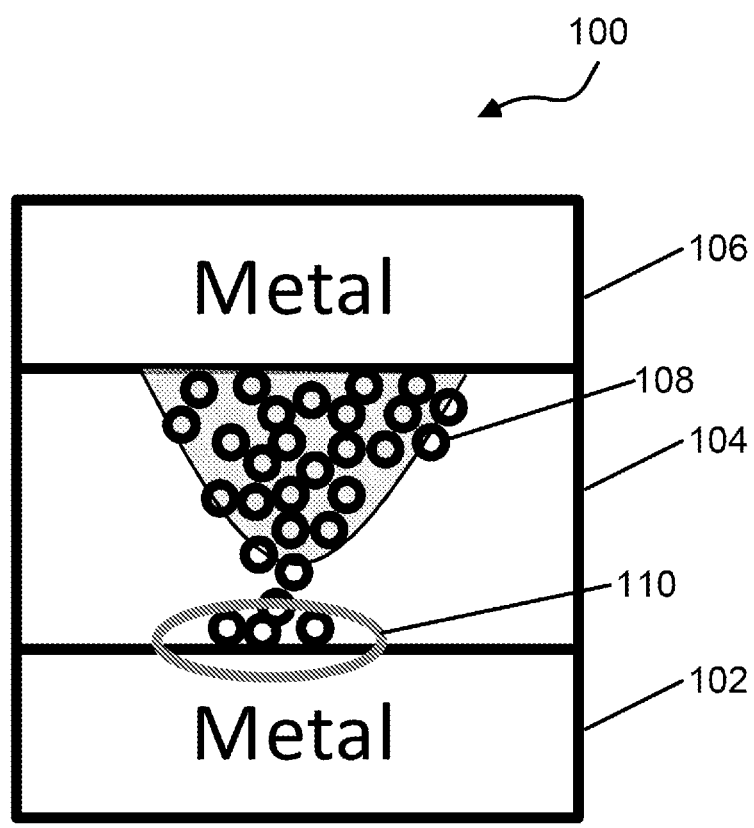
FIG. 1 is a simplified diagram illustrating a conventional resistive switching device

FIG. 1 is a simplified diagram illustrating a conventional resistive switching device 100. As shown, the conventional resistive switching device includes a first metal electrode 102, a second metal electrode 106, and a switching material 104 sandwiched between the first metal electrode and the second metal electrode. For example, the second metal electrode can include at least a noble metal such as silver, gold, palladium, platinum or other suitable metals depending on the application. The first metal material can include common metals used in semiconductor processing such as tungsten, copper, or aluminum. The switching material used is usually a non-conductive material having defect sites or grain boundaries or non-stoichiometric sites allowing a plurality of metal particles from the second metal electrode to form a metal region 108 when a voltage is applied to the second electrode or the first electrode. The metal region further includes a metal filament structure extending towards the first electrode and preferably not in contact with the first electrode. The metal filament extends in a write or read cycle and retracts during an erase cycle. As shown in FIG. 1, as the number of defect sites is high in an interface region 110 formed from the first metal electrode and the switching material, a high concentration of metal particles has the propensity to form in the interface region. This leads to a large on state current and a low on-state resistance. As the device is cycled through a number of on/off cycles, the metal regions initially formed in a portion of the amorphous silicon material may expand too close to the first metal electrode. The metal filament near the first metal electrode may not retract during erase cycles. The metal particles may even coalesce if the defect density is too high and the electrodes are shorted; resulting in a failed device.

The terms 'second" or "first" throughout the present application are for description and illustration only and should not be construed as the physical arrangement of the electrodes.

Figure 2:
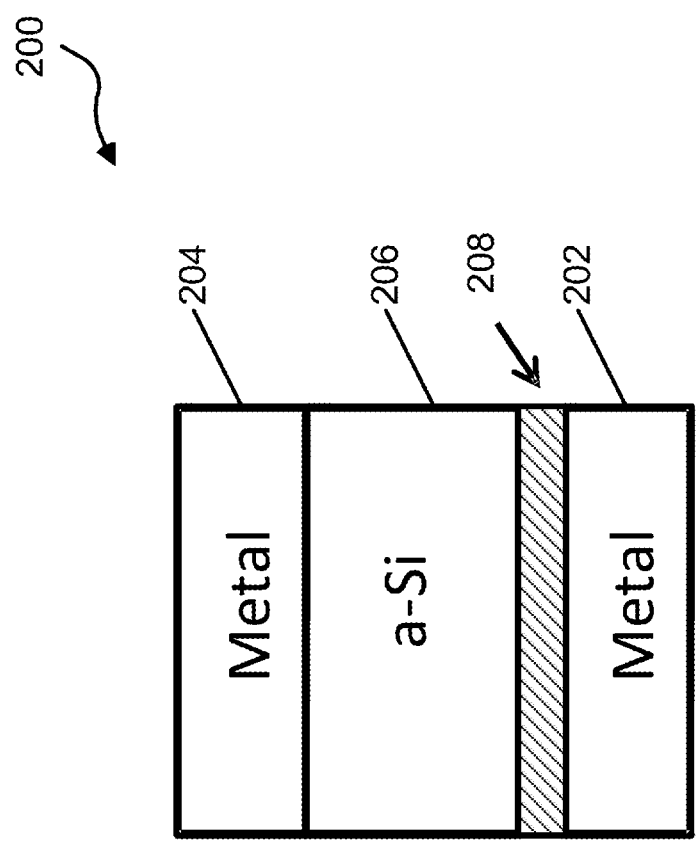
FIG. 2 is a simplified diagram illustrating a resistive switching device according to an embodiment of the present invention

FIG. 2 is a simplified diagram of a resistive switching device 200 according to an embodiment of the present invention. The resistance switching device is formed overlying a substrate in a specific embodiment. The substrate can be a semiconductor substrate having one or more CMOS devices formed thereon. The one or more CMOS devices are operably coupled to the resistive switching device providing controlling circuitry for the memory device in a specific embodiment. As shown, the resistive switching device includes a first metal electrode 202, a second metal electrode 204, a switching layer 206, and a buffer layer 208. As shown, the buffer layer is disposed between the switching layer and the first electrode in a specific embodiment.

In a specific embodiment, the first metal electrode can be formed from metal material such as copper, aluminum, or tungsten depending on the application. In a specific embodiment, the first metal electrode can further include one or more adhesion layer or barrier layer to prevent metal from the first electrode to diffusion into other parts of the device or an adhesion layer to prevent the metal material to delaminate from, for example, the dielectric layer, depending on the embodiment.

Referring to FIG. 2, the resistive switching device includes switching layer 206. In a specific embodiment, the switching layer comprises an amorphous silicon material. The amorphous silicon material is undoped or having a semiconductor characteristic in a specific embodiment. In a specific embodiment, the amorphous silicon material includes a plurality of defect sites. The plurality of defect sites can arise from silicon dangling bonds, or atomic dislocations, or crystal plane dislocation, or molecular dislocation, or grain boundaries between silicon crystals depending on the process condition.

Resistive switching device 200 includes second metal electrode 204 overlying the switching layer. The second metal electrode includes a metal material, which has a high diffusivity in the switching material in a specific embodiment. The metal material can be silver, copper, aluminum, or other suitable metal materials, including alloy or a combination. In a specific embodiment, the metal material can be silver for an amorphous silicon material as the switching layer. As silver is not commonly used in silicon processing, the silver material forms just a portion of a wiring structure for the switching device, while other portions of the wiring structure comprises convention conducting material such as tungsten, copper or aluminum in a specific embodiment. In a specific embodiment, the silver material is in contact with the amorphous silicon material.

As described, due to material mismatch between the amorphous silicon material and the first electrode, the defect density at the interface region formed from the first metal electrode and the amorphous silicon material in a conventional structure is high. The silver particles in the filament structure are close to each other resulting in a high on state current. After certain number of on/off cycles, the silver particles may coalesce and the silver particles may not be able to retract in an off cycle forming a short between the second electrode and the first electrode, and the device becomes defective. In a specific embodiment, buffer layer 208 is disposed between the first metal electrode and the switching layer. The buffer layer is provided to prevent an interface region to form from the amorphous silicon material and the first electrode and to control defect density of amorphous silicon and metal particles near the first electrode. The buffer layer is selected to have a good and reliable adhesion with the first electrode as well as the amorphous silicon layer. Additionally, an interface region formed from the amorphous silicon material and the buffer layer should have a small defect density for reliable switching and good endurance. The buffer layer is engineered, for example, by adjusting buffer layer resistance, to provide a suitable on state resistance and power consumption during programming.

Figure 3:
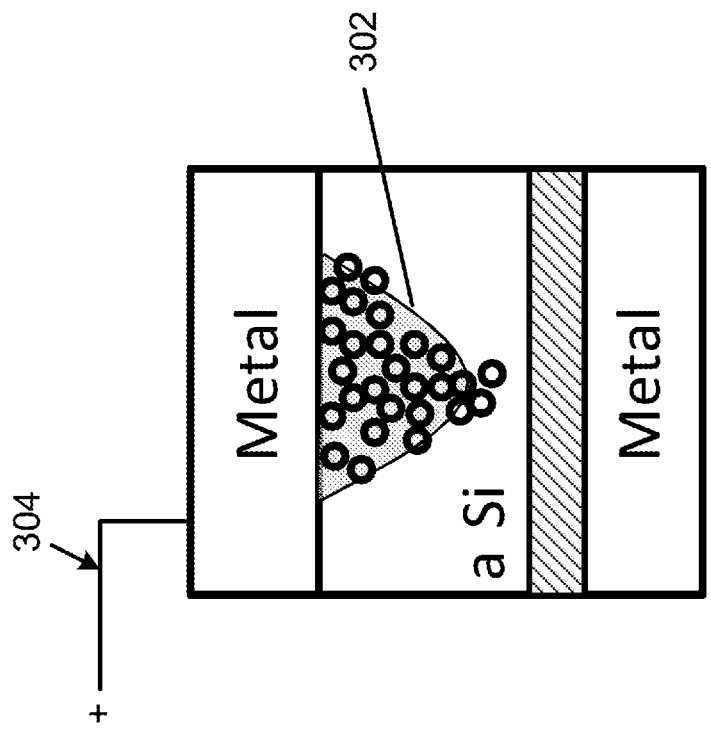
FIG. 3 is a simplified diagram illustrating an off state of the resistive switching device according to an embodiment of the present invention.

Referring to FIG. 3, when a first positive voltage 304 is applied to the second electrode of an as fabricated device, a local electric field is generated and silver particles in various forms, including atoms, ions, or clusters are formed in the amorphous silicon material in a specific embodiment. More specifically, silver particles are formed and trapped in defect sites of the amorphous silicon material. The local electric field enhances silver diffusion in the amorphous silicon material and forms a metal region 302 comprises of the silver particles in a specific embodiment. This first positive voltage can be in the range of 4 volts to about 6 volts depending on the process condition of the amorphous silicon material. As shown the metal region is formed in vicinity of the second electrode surface region, and not in contact with the first electrode. In a specific embodiment, the first positive voltage is a forming voltage or electroforming voltage for the switching device. The switching device is in now in an off state.

Figure 4:
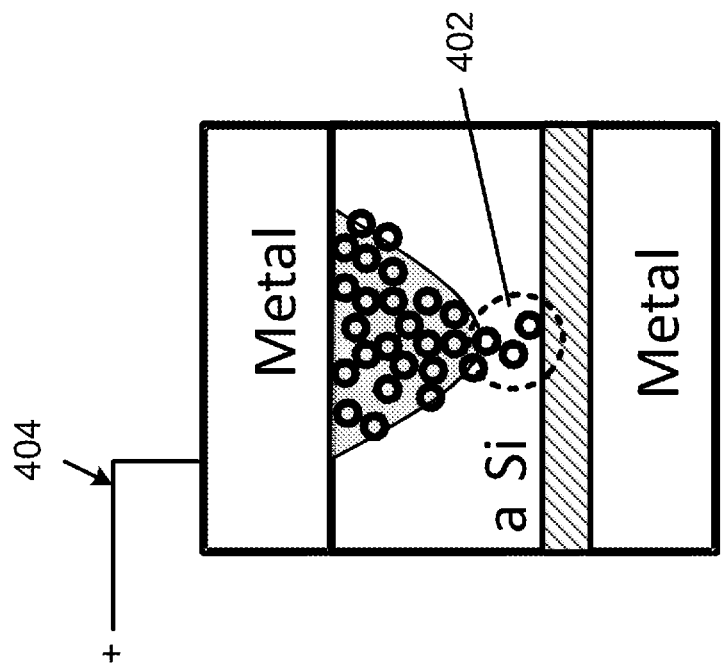
FIG. 4 is a simplified diagram illustrating an on state of the resistive switching device according to an embodiment of the present invention.

Referring to FIG. 4, when a second voltage 404 is applied to the second electrode, a filament structure 402 extending from the metal region is formed. As shown, the buffer layer functions as a blocking layer such that the filament structure would not extend to be in contact with the first electrode in a specific embodiment. The second voltage can be, for example, a write voltage for the switching device in a specific embodiment. The switching device is in an on state and an on state current flow s between the second electrode and the first electrode. The on state current is controlled by the length of the filament structure in a specific embodiment. In a specific embodiment, the on state current can range from a few nano amperes to micro amperes, much less than that of a conventional switching device absent of the buffer layer.

Figure 5B:
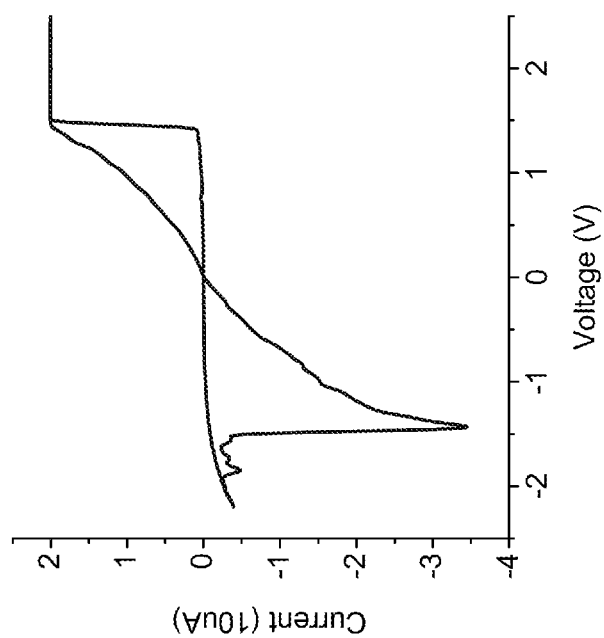
FIGS. 5a and 5b are simplified current versus voltage (I-V) plots of resistance device according to embodiments of the present invention.
Figure 5A:
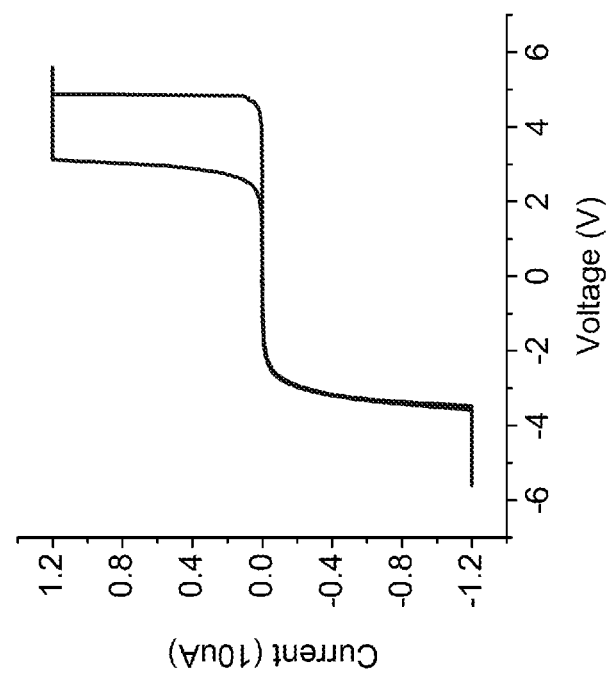

In a specific embodiment, for a proper function of a resistive switching device, the buffer layer should have good contact with the first electrode to allow a low contact resistance (or forming an ohmic contact) in a contact region formed from the buffer layer and the first electrode. The low contact resistance avoids excess voltage drop across the contact region in a specific embodiment. FIG. 5(a) illustrates a switching characteristic of a first switching device having a non-ohmic contact (that is, high contact resistance) between the buffer layer and the first electrode. The high contact resistance between the buffer layer and the first electrode suppresses current flow at small bias and certain read operation at low voltage cannot be performed properly. The first switching device is further characterized by a high programming voltage (>5 volts) and may cause an early device failure and high leakage current, among others. FIG. 5(b) illustrates a switching characteristic of a second switching device having a good ohmic contact between the buffer layer and the first electrode or the contact resistance is low. The second switching device exhibits desirable switching characteristic, for example, low programming voltage, between 1-2 volts.

In certain embodiments, the buffer layer can include an insulating layer. The insulating layer should be thin, for example less than about 2 nm, so that electrons can tunnel across the thin insulating buffer layer from a conducting metal region, for example, silver particles in the switching layer and the first electrode. Electron tunneling allows for the device to be in an on state when a suitable voltage is applied to the electrodes. Electron tunneling also allows for proper read operation of the device when a small bias voltage is applied. The contact resistance between such buffer layer and the first electrode may not be as critical in a specific embodiment.

In a specific embodiment, the buffer layer can include a material having a higher density than the amorphous silicon material to prevent silver particles from being injected into the buffer layer and forming conducting filament in the buffer layer. In an alternative embodiment, the buffer layer can be conductive having a large thickness (for example, about 20 nm or greater). Of course one skilled in the art would recognize other variations, modifications, and alternatives.

It has been observed that resistive switching devices using amorphous silicon as the switching material and silver as the second electrode can have vastly different switching characteristics depending on the deposition process of amorphous silicon material. When the amorphous silicon material is formed using a sputtering process, a high voltage, greater than about 8 volts is required to read, to write or to erase. This suggests that silver particles do not form easily in the sputtered amorphous silicon at normal device operation voltage. Sputtered amorphous silicon contains an insignificant amount of hydrogen and tends to have a high density.

Hence a thin (preferably less than 5 nm) sputtered amorphous silicon can be used as the buffer layer in a specific embodiment.

For amorphous silicon formed using a plasma enhanced chemical vapor deposition (PECVD) or a low pressure chemical vapor deposition (LPCVD) process and silane as a silicon source, switching voltages are usually lower, ranging from one to four volts, depending on the process conditions. Amorphous silicon material formed by a CVD process using silane contains hydrogen, which can diffuse or migrate in and out of the silicon matrix, leaving void sites in the material. Silver particles can occupy these void sites or defect sites and allow to migrate upon application of a voltage. It has also been observed that devices merely uses a metal/amorphous silicon/metal configuration have a low on/off endurance, that is such device fails after at most a few thousand on/off cycles.

Figure 6:
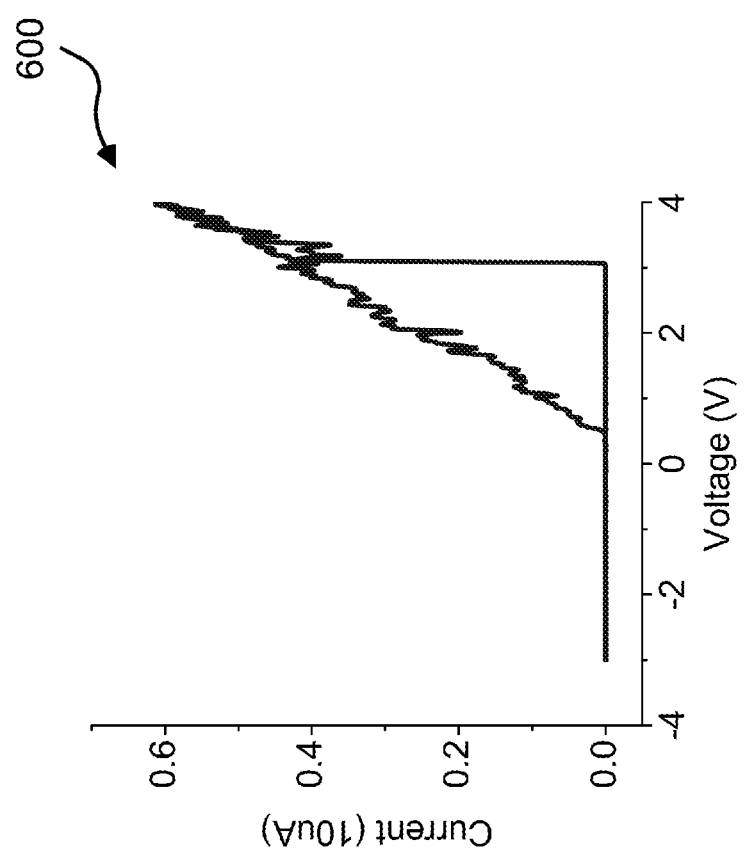
FIG. 6 is a simplified I-V plot of a switching device according to an embodiment of the present invention.

As merely an example, the buffer layer can include a polysilicon material. The polysilicon material is preferably p+ doped and having an impurity concentration ranging from about $10^{18}$ to about $10^{22}$ atoms per $cm^3$. As shown in FIG. 6, a current versus voltage (I-V) plot 600 of a third switching device is provided. The third switching device has a silver/amorphous silicon/p+ polysilicon device structure. The amorphous silicon material in the third switching device is deposited using a low pressure chemical vapor deposition process at a deposition temperature of about 510 Degree Celsius using silane as a silicon source.

Figure 7:
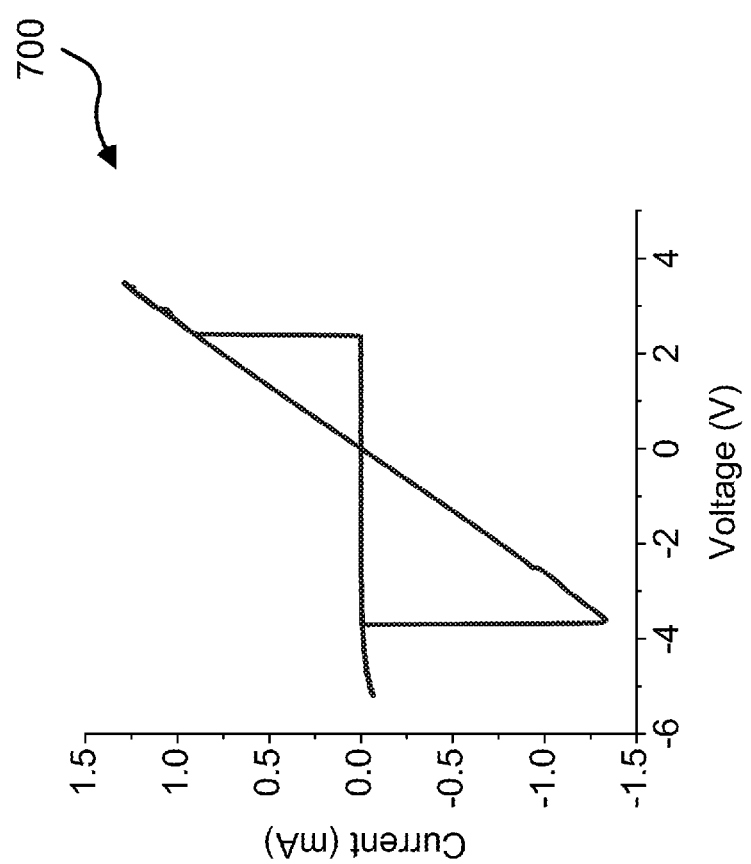
FIG. 7 is a simplified I-V plot of a conventional switching device.

FIG. 7 illustrates an I-V plot 700 measured from a fourth switching device having a conventional silver/amorphous silicon/nickel device structure. The amorphous silicon in the second switching device is deposited using a plasma enhanced chemical vapor deposition process at a deposition temperature of about 370 Degree Celsius. Both the third switching device and the fourth switching device have a cell size of about 60 nm by 60 nm. Typically, amorphous silicon material deposited at 370 Degree Celsius by a CVD method has a much lower defect density than one deposited at 510 Degree Celsius. The fourth device is thus expected to have a lower on state current than that of the third switching device. However, as the defect density is higher at the interface region formed by the amorphous silicon and the first metal material, nickel in this case, the on state current of the fourth device (plot 700) is much higher, in mA range, than that of the third device (plot 600). High current is not desirable as it results in an unreliable device operation. The polysilicon buffer layer in the third switching device prevents excess defect density near the first electrode, and the programming current is much lower, in the uA range, as shown in plot 600. Additionally, the polysilicon buffer layer can be modified easily, by changing its thickness or conductivity to control the programming current and further enhance device performance. One skilled in the art would recognize other variations, modifications, and alternatives.

In a specific embodiment, a method of forming a resistive switching device is provided. The method includes providing a semiconductor substrate having a surface region. The semiconductor substrate can have one or more CMOS devices formed thereon. The semiconductor substrate can be single crystal silicon material, silicon germanium, silicon on insulator, and the likes. A first dielectric material is formed overlying the surface region. The first dielectric material can be silicon oxide, silicon nitride, silicon oxynitride, and others. The first dielectric material can be deposited using techniques such as chemical vapor deposition including plasma enhanced chemical vapor deposition, physical vapor deposition, spin on coating, and any combinations of these, and others.

In a specific embodiment, the method includes forming a first electrode overlying the first dielectric material. The first electrode is formed from a conductor material commonly used in semiconductor processing. The conductor material can include tungsten, copper, or aluminum depending on the application. The first electrode can include one or more adhesion layer or diffusion barrier. The adhesion layer may be titanium, titanium nitride, tantalum nitride, or tungsten nitride to prevent diffusion of the conductor material into the first dielectric material in a specific embodiment. Depending on the application, the conductor material can be deposited using a physical vapor deposition process, a chemical vapor deposition process, electrochemical including electroplating and electroless plating, and combination thereof. The conductor material including the adhesion layer is subjected to a pattern and etch process to form a first electrode. In a specific embodiment, the first structure is configured to extend in a first direction. Of course one skilled in the art would recognize other variations, modifications, and alternatives.

The method includes depositing a buffer layer overlying the first electrode in a specific embodiment. The buffer layer should have properties to allow desirable switching characteristic for the switching device. The buffer layer should also form a reliable interface with selected switching material used in the switching device. A high density material may be used to prevent metal particles to inject into the buffer layer. The buffer layer can be a conductive material or an insulating material depending on the embodiment. A conductive buffer layer can include a p-doped silicon material such as p+ polysilicon material in a specific embodiment. An insulating buffer layer should have a thickness less than about 5 nm so that electrons can tunnel through at operating voltages (between 1-3 volts).

For an amorphous silicon material as switching material, a polysilicon material can be used for the buffer layer. The polysilicon material is preferably having a p+ type impurity characteristic, which may be provided using a boron species in a specific embodiment. The p+ polysilicon material may be deposited using a chemical vapor deposition technique using at least silane, disilane, or a suitable chlorosilane as precursor.

The method forms a switching material overlying the buffer material. As merely an example, the switching material is an amorphous silicon material deposited using techniques such as chemical vapor deposition using silane, disilane, or chlorosilane as silicon source. Deposition temperatures is usually at about 250 Degree Celsius to about 600 Degree Celsius depending on the embodiment. Process parameters and process conditions greatly influence defect density in the amorphous silicon material and switching behavior of the switching device. Therefore, the use of amorphous silicon switching material provides flexibility in device design in a specific embodiment.

In a specific embodiment, the method includes depositing a second electrode material overlying the switching material. The second electrode material has a first portion that includes a metal material in direct contact with the switching material. The metal material is preferably having a suitable diffusion characteristic in the amorphous silicon material in a preferred embodiment. The metal material can be silver in a specific embodiment. Other suitable metal materials may also be used. These other materials can include platinum, palladium, gold, copper, nickel, and others. The second electrode material further includes a second portion for electrical connection with other devices. The second portion can be selected from tungsten, copper, or aluminum, commonly used in semiconductor processing. The method forms a second electrode structure by a suitable pattern and etch process. In a specific embodiment, the second electrode structure is configured to extend in a second direction at an angle to the first direction. In a preferred embodiment the second electrode structure and the first electrode structure are arranged orthogonal to each other having a switching element sandwiched at an intersecting region formed from the second electrode and the first electrode. One skilled in the art would recognized other variations, modifications, and alternatives.

The method then performs other backend processes such as global interconnects and passivation among others to form a resistive switching memory device.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims

What is claimed is:

1. A device having a resistive switching device, comprising:
   a semiconductor substrate;
   a plurality of CMOS devices formed upon the semiconductor substrate;
   an insulating layer disposed upon the plurality of the CMOS devices; and
   a resistive switching device disposed upon the insulating layer and coupled to at least a CMOS device of the plurality of CMOS devices, wherein the resistive switching device comprising:
      a first wiring structure disposed upon the insulating layer comprising a first metal material;
      a buffer material disposed adjacent to and touching the first wiring structure;
      a non-stoichiometric switching material disposed adjacent to and touching the buffer material, wherein the non-stoichiometric switching material comprises a material having a plurality of non-stoichiometric defect sites;
      a second wiring structure disposed and touching the non-stoichiometric switching material having at least a portion comprising a second metal material having a plurality of metal particles;
      wherein at least some metal particles derived from the plurality of metal particles of the second wiring structure are removably disposed within non-stoichiometric defect sites from the plurality of non-stoichiometric defect sties; and
      wherein the buffer material completely separates the first wiring structure and the non-stoichiometric switching material, and wherein the buffer material is substantially free from metal particles from the second wiring structure.

2. The device of claim 1 wherein the plurality of CMOS devices comprises a control circuit for the resistive switching device.

3. The device of claim 1 wherein the first wiring structure also comprises a material selected from a group consisting of: an adhesion material and a barrier material.

4. The device of claim 1 wherein the second wiring structure also comprises a metal selected from a group consisting of: tungsten, copper, aluminum.

5. The device of claim 1 wherein the second metal material is selected from a group consisting of: silver, copper, aluminum, a metal alloy, platinum, palladium, gold, copper, and nickel.

6. The device of claim 1 wherein the metal particles from the plurality of metal particles that are disposed within the non-stoichiometric defect sites forms a conductive metal region beginning in a vicinity of the second wiring structure and directed towards the first wiring structure.

7. The device of claim 1 wherein the buffer material has a thickness of less than about 2 nm.

8. The device of claim 1 wherein the buffer material comprises a polycrystalline silicon-containing material having a p+ impurity characteristic.

9. The device of claim 1 wherein the buffer material inhibits the metal particles from the second wiring structure from contacting the first wiring structure.

10. The device of claim 1 wherein the buffer material comprises an electron tunneling layer.

11. A method for forming a device having a high endurance resistive switching device, comprising:
    receiving a semiconductor substrate having a plurality of CMOS devices formed thereon and having an insulating layer disposed upon the plurality of the CMOS devices;
    forming a first wiring structure upon the insulating layer comprising a first metal material;
    forming a buffer material adjacent to and touching the first wiring structure;
    forming a non-stoichiometric switching material adjacent to and touching the buffer material, wherein the non-stoichiometric switching material comprises a material having a plurality of non-stoichiometric defect sites;
    forming a second wiring structure adjacent to and touching the non-stoichiometric switching material having at least a portion comprising a second metal material having a plurality of metal particles, wherein the first metal material, the buffer material, the non-stoichiometric switching material and the second metal material forms a resistive switching device;
    coupling the resistive switching device to at least a CMOS device of the plurality of CMOS devices;
    wherein the plurality of non-stoichiometric defect sites are configured to releasably trap metal particles derived from the plurality of metal particles of the second wiring structure;
    wherein the buffer material completely separates the first wiring structure and the non-stoichiometric switching material.

12. The method of claim 11 wherein the plurality of CMOS devices comprises a control circuit for the resistive switching device.

13. The method of claim 11 wherein the forming first wiring structure also comprises forming a material layer selected from a group consisting of: an adhesion material and a barrier material.

14. The method of claim 11 wherein the forming the second wiring structure also comprises forming a metal layer selected from a group consisting of: tungsten, copper, aluminum.

15. The method of claim 11 wherein the second metal material is selected from a group consisting of: silver, copper, aluminum, a metal alloy, platinum, palladium, gold, copper, and nickel.

16. The method of claim 11 wherein the buffer material has a thickness of less than about 2 nm.

17. The method of claim 11 wherein the buffer material has a thickness of less than about 5 nm.

18. The method of claim 11 wherein the buffer material comprises a polycrystalline silicon-containing material having a p+ impurity characteristic.

19. The method of claim 18 wherein the p+ impurity characteristic for the buffer material is associated with a impurity concentration within a range of about 10E18 to about 10E22 atoms per cm3.

20. The method of claim 11 wherein a density of the buffer material is higher than a density of the non-stoichiometric switching material.

* * * * *